(12) United States Patent  
Eristoff et al.

(10) Patent No.: US 9,157,145 B2  
(45) Date of Patent: Oct. 13, 2015

(54) PROCESSING TOOL WITH COMBINED SPUTTER AND EVAPORATION DEPOSITION SOURCES

(75) Inventors: D. Guy Eristoff, Singapore (SG); Michael S. Barnes, San Ramon, CA (US); Arthur C. Wall, Morgan Hill, CA (US); Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 1521 days.

(21) Appl. No.: 12/512,010

(22) Filed: Jul. 29, 2009

(65) Prior Publication Data

US 2010/0024731 A1 Feb. 4, 2010

Related U.S. Application Data

(60) Provisional application No. 61/084,600, filed on Jul. 29, 2008.

(51) Int. Cl.
  *C23C 18/54* (2006.01)
  *C23C 14/34* (2006.01)
  *C23C 14/22* (2006.01)
  (Continued)

(52) U.S. Cl.
  CPC ............... *C23C 14/22* (2013.01); *C23C 14/24* (2013.01); *C23C 14/34* (2013.01); *C23C 14/568* (2013.01)

(58) Field of Classification Search
  CPC ........ C23C 14/24; C23C 14/34; C23C 14/568
  USPC ................................................. 118/719, 726
  See application file for complete search history.

(56) References Cited

U.S. PATENT DOCUMENTS

| 3,492,215 A | 1/1970 | Contant |
| 4,401,052 A | 8/1983 | Baron et al. |

(Continued)

FOREIGN PATENT DOCUMENTS

| CN | 1845306 A | 10/2006 |
| CN | 101174556 A | 5/2008 |

(Continued)

OTHER PUBLICATIONS

R.N. Sacks, et al., "Promising new valved source for Ga or In evaporation," Journal of Vacuum Science and Technology B, May/Jun. 2007, pp. 983-986, vol. 25, Issue No. 3, American Vacuum Society.

(Continued)

*Primary Examiner* — Parviz Hassanzadeh
*Assistant Examiner* — Nathan K Ford
(74) *Attorney, Agent, or Firm* — Nixon Peabody LLP; Joseph Bach, Esq.

(57) ABSTRACT

A substrate processing system particularly suitable for fabricating solar cells. The system has a front end module transporting cassettes, each cassette holding a preset number of substrates therein; a loading module coupled to the front end module and having mechanism for loading substrates from the cassettes onto carriers; and a plurality of processing chambers coupled to each other in series, each having tracks for transporting the carriers directly from one chamber to the next; wherein selected chambers of the plurality of processing chambers comprise at least one combination source having a sputtering module and an evaporation module arranged linearly in the direction of travel of the carriers.

21 Claims, 6 Drawing Sheets

(51) Int. Cl.
*C23C 14/24* (2006.01)
*C23C 14/56* (2006.01)

(56) References Cited

U.S. PATENT DOCUMENTS

| | | | |
|---|---|---|---|
| 4,902,934 A | | 2/1990 | Miyamura et al. |
| 5,215,420 A | | 6/1993 | Hughes et al. |
| 5,417,537 A | | 5/1995 | Miller |
| 5,425,611 A | | 6/1995 | Hughes et al. |
| 5,439,575 A | * | 8/1995 | Thornton et al. ........ 204/192.25 |
| 5,543,022 A | | 8/1996 | Nguyen et al. |
| 5,697,749 A | | 12/1997 | Iwabuchi et al. |
| 5,844,195 A | | 12/1998 | Fairbairn et al. |
| 5,846,328 A | * | 12/1998 | Aruga et al. ................. 118/718 |
| 6,244,811 B1 | | 6/2001 | Kroeker et al. |
| 6,251,232 B1 | | 6/2001 | Aruga et al. |
| 6,270,306 B1 | | 8/2001 | Otwell et al. |
| 6,319,373 B2 | | 11/2001 | Takeyama et al. |
| 6,502,054 B1 | | 12/2002 | Mooring et al. |
| 6,682,343 B2 | | 1/2004 | Takahashi |
| 6,827,788 B2 | | 12/2004 | Takahashi |
| 6,852,194 B2 | | 2/2005 | Matsushita et al. |
| 6,919,001 B2 | | 7/2005 | Fairbairn et al. |
| 6,955,517 B2 | | 10/2005 | Nulman et al. |
| 6,970,770 B2 | | 11/2005 | Iljima et al. |
| 6,974,976 B2 | | 12/2005 | Hollars |
| 7,039,501 B2 | | 5/2006 | Freeman et al. |
| 7,198,447 B2 | | 4/2007 | Morimitsu et al. |
| 7,198,448 B2 | | 4/2007 | Ozawa et al. |
| 7,245,989 B2 | | 7/2007 | Hosek et al. |
| 7,407,358 B2 | | 8/2008 | Takahashi |
| 7,576,017 B2 | | 8/2009 | Tuttle |
| 7,833,351 B2 | | 11/2010 | Webb et al. |
| 8,177,912 B2 | | 5/2012 | Oda et al. |
| 2002/0026984 A1 | | 3/2002 | Marxer et al. |
| 2002/0153578 A1 | | 10/2002 | Aggarwal et al. |
| 2003/0131458 A1 | | 7/2003 | Wang et al. |
| 2003/0211275 A1 | | 11/2003 | Buitron et al. |
| 2006/0096635 A1 | | 5/2006 | Tuttle |
| 2006/0105548 A1 | | 5/2006 | Kudo et al. |
| 2007/0283996 A1 | | 12/2007 | Hachtmann et al. |
| 2008/0053519 A1 | | 3/2008 | Pearce et al. |
| 2008/0115729 A1 | * | 5/2008 | Oda et al. ...................... 118/726 |
| 2008/0232948 A1 | | 9/2008 | van der Meulen et al. |
| 2008/0251120 A1 | | 10/2008 | Malmstrom et al. |
| 2008/0289953 A1 | | 11/2008 | Hollars |
| 2009/0194026 A1 | | 8/2009 | Burrows et al. |
| 2009/0324369 A1 | | 12/2009 | Scollay et al. |

FOREIGN PATENT DOCUMENTS

| | | |
|---|---|---|
| CN | 101630634 A2 | 1/2010 |
| EP | 1526565 A2 | 4/2005 |
| EP | 2141739 A2 | 1/2010 |
| JP | 2004-179567 A | 6/2004 |
| JP | 2010-062534 A | 3/2010 |
| WO | 2010/014761 A1 | 2/2010 |

OTHER PUBLICATIONS

F. Geiger, et al., "The vapor pressure of indium, silver, gallium, copper, tin, and gold between 0.1 and 3.0 bar," International Journal of Thermophysics, Jul. 1987, pp. 425-436, vol. 8, No. 4, Springer Netherlands.
International Search Report and Written Opinion in International Application No. PCT/US09/52167, mailed Sep. 15, 2009.
Notice of Allowance for U.S. Appl. No. 12/495,740 dated Oct. 22, 2014.
Office Action for U.S. Appl. No. 12/495,740 dated Mar. 14, 2014.
Advisory Action for U.S. Appl. No. 12/495,740 dated Aug. 14, 2012.
Office Action for U.S. Appl. No. 12/495,740 dated Apr. 25, 2012.
Notice of Non-Compliant Amendment for U.S. Appl. No. 12/495,740 dated Dec. 20, 2011.
Office Action for U.S. Appl. No. 12/495,740 dated May 25, 2011.
First Office Action in Chinese Patent Application No. 200910158447.0 dated May 2, 2013.
Notification of Filing Divisional Application in Chinese Patent Application No. 200910158447.0 dated Dec. 4, 2012.
Search Report in European Application No. 09164187.8 dated Dec. 10, 2010.
Intention to Grant in European Application No. 09164187.8 dated Mar. 7, 2014.
International Preliminary Report on Patentability for PCT Application No. PCT/US2009/052167 dated Feb. 10, 2011.
"Spike RTA+ms annealing may delay need for metal gates," Solid State Technology—Technology News, Oct. 2007.
Rommel Noufi, et al., "High-Efficiency CDTE and CIGS Thin-Film Solar Cells: Highlights and Challenges," National Renewable Energy Laboratory, May 2006.
A. Compaan, et al., "Fabrication and Phyics of CdTe Devices by Sputtering," Final Report Mar. 1, 2005-Nov. 30, 2008, National Renewable Energy Laboratory, Apr. 2009.

* cited by examiner

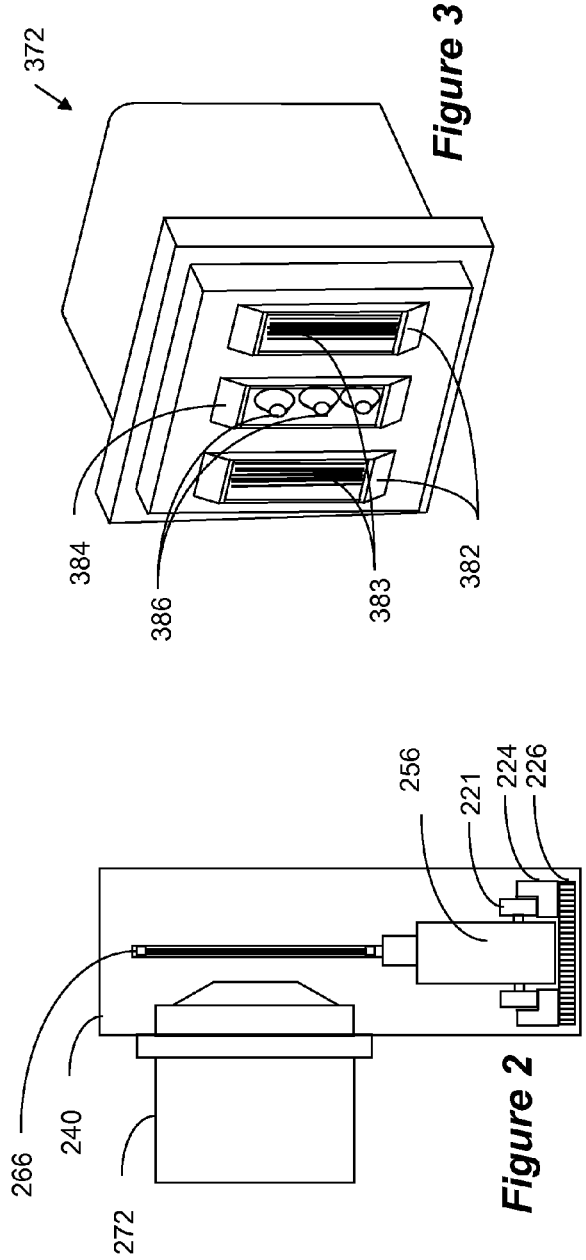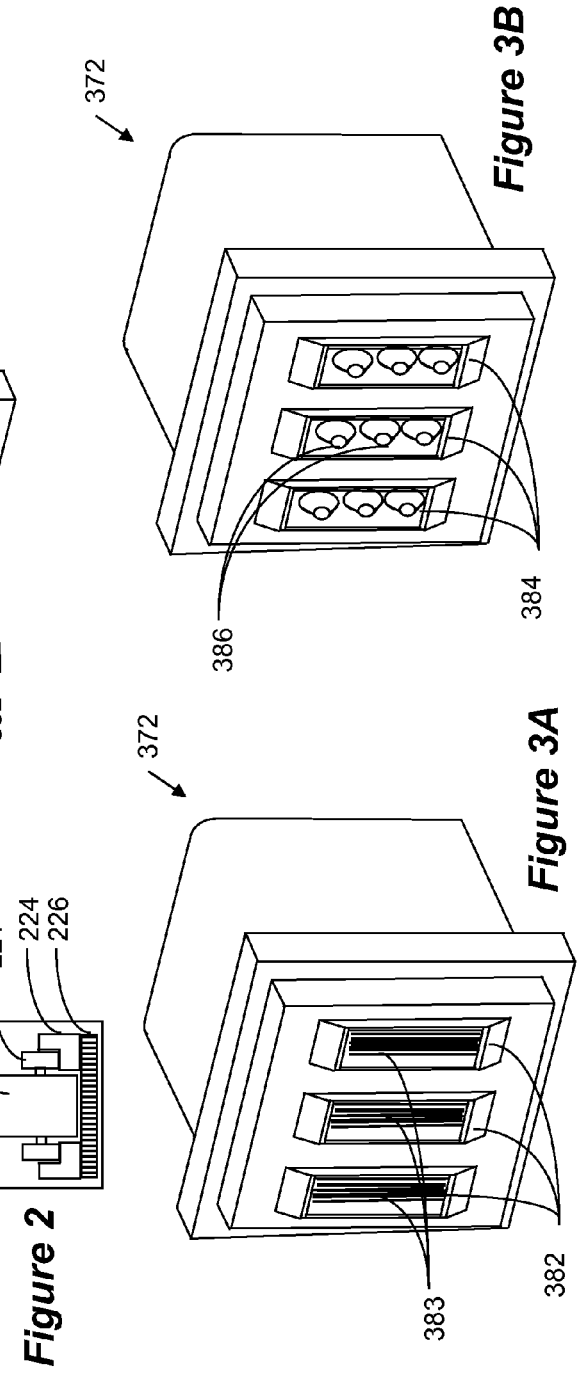

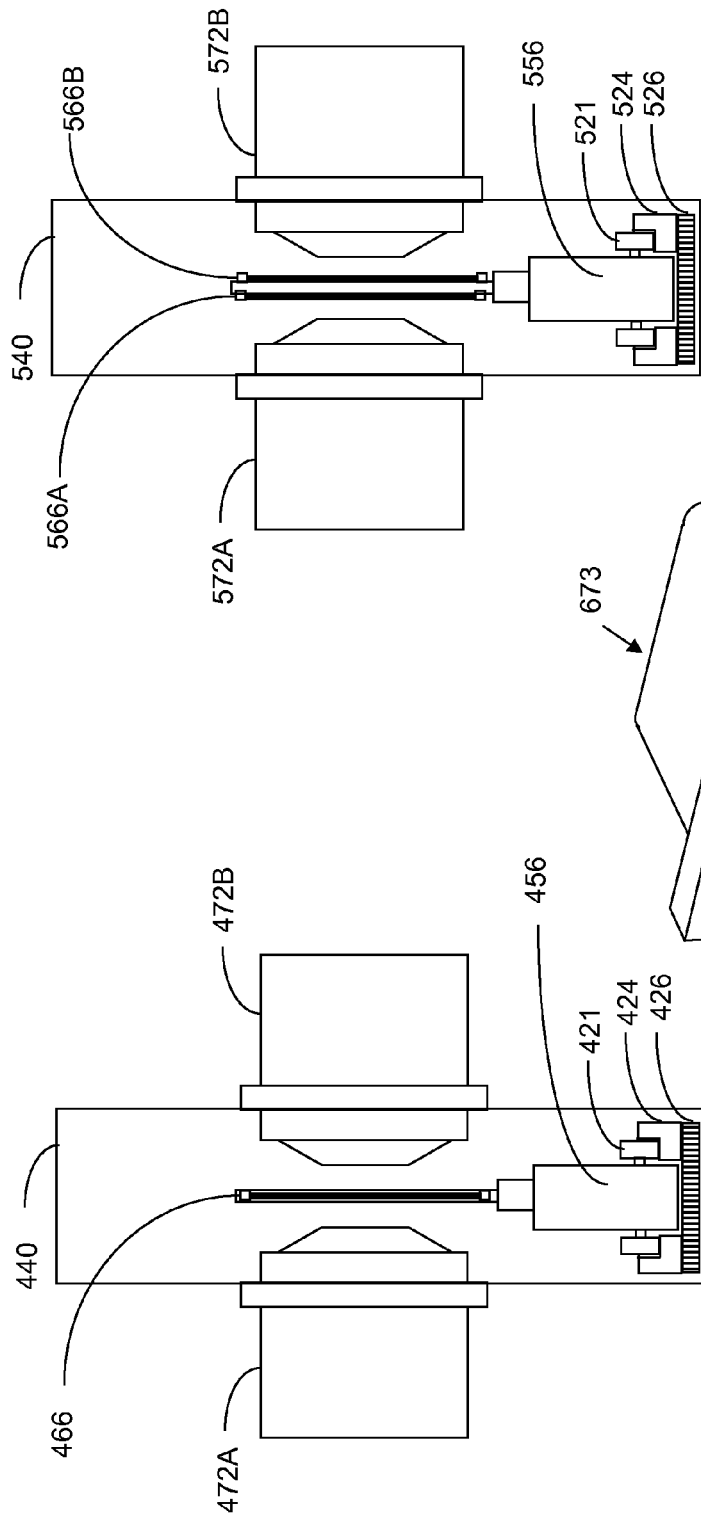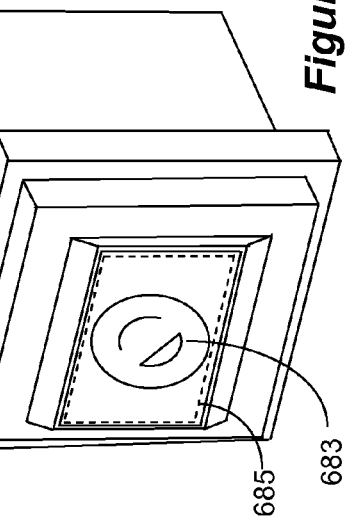

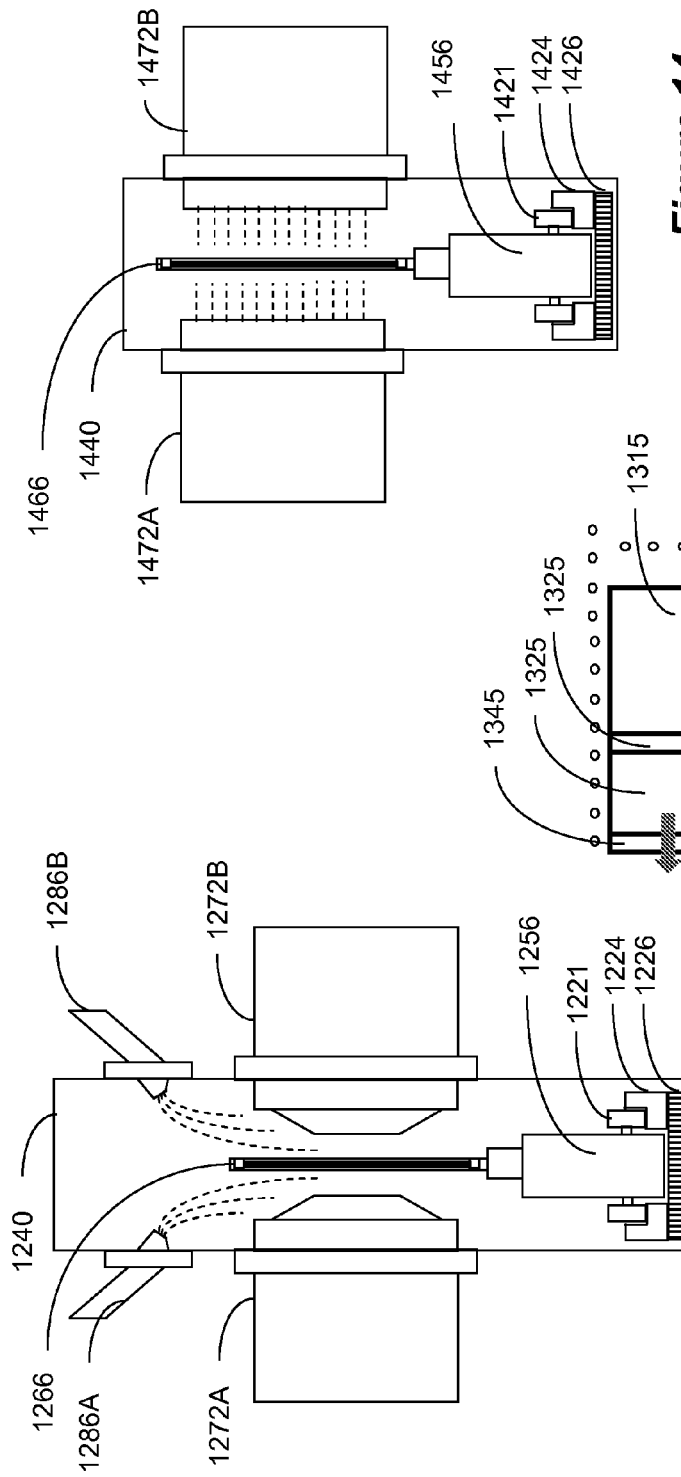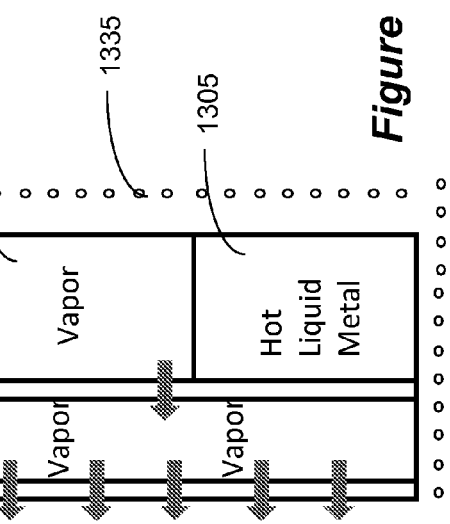

PROCESSING TOOL WITH COMBINED SPUTTER AND EVAPORATION DEPOSITION SOURCES

RELATED APPLICATIONS

This application claims priority benefit from U.S. provisional application Ser. No. 61/084,600, filed on Jul. 29, 2008, the entire disclosure of which is incorporated herein by reference.

BACKGROUND

1. Field

The subject invention relates to processing of substrates and, more specifically, for systems for forming thin films over substrates to produce devices, such as solar cells.

2. Related Art

Vacuum processing systems are used to fabricate hard-drive disks, semiconductor computer chips, solar panels, and the like, from substrates made of materials such as semiconductor wafers, glass, stainless steel, etc. Typically, the vacuum processing systems include several substrate chambers that perform various processes that modify the substrate by performing deposition, cleaning, etching, heating/cooling, etc., on the substrate. Deposition of films is generally accomplished using, e.g., physical vapor deposition (PVD) or chemical vapor deposition (CVD). PVD can be performed using, e.g., sputtering or evaporation systems. Sputtering process can be controlled relatively well and thin films formed using sputtering sources can be of high quality and uniformity. However, sputtering sources are relatively expensive and target utilization is relatively low. On the other hand, evaporation systems are relatively of low cost and high utilization, albeit they are more difficult to control to form films of precise thickness and uniformity.

Fabrication of solar cells is a recent emerging field which utilizes thin film technologies. There are several basic forms of solar cells, including c-Si, a-Si:H, n-Si:H, CIS/CIGS/CIGS-S, CdTe, GaAs and Organic or Dye Sensitized devices. There are many layer combinations that comprise modern cells, many of which may be fabricated using thin film fabrication techniques. For example, absorber layers, low resistivity rear electrodes, high resistivity intermediate or buffer layers and high optical transmission moderate resistivity window layers are essential components in the fabrication of solar cells. In order to tailor such layers to achieve requisite results on specified figures of merit, such as Voc, Isc, Fill Factor, conversion efficiency and numerous other parameters, precise atomic concentrations of materials must be deposited.

While precise formation of the various layers is paramount to achieving high performing solar cells, the speed of fabrication required in the market of solar cells is rather high. For example, traditional semiconductor fabrication equipment provides order of magnitudes slower throughput than required by the solar industry and is, therefore, inadequate. Consequently, fabricators of solar cells are in constant search for manufacturing equipment that can provide the required precision, but at exceedingly high throughput.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

The subject invention aims to solve the problems present in the prior art. Embodiment of the subject invention utilize novel deposition technology to produce precise layers at very high throughput. Systems made according to embodiments of the invention can be beneficially utilized to form thin films, for example, bi- or multi-layer, films of single or several nanometer-thick, which can be utilized for formation of, e.g., enhanced absorber and window layers of solar cells.

According to aspects of the invention, sputter deposition sources and evaporation effusion cells are utilized in situ in a continuous deposition process to form the thin films.

According to an aspect of the invention, a substrate processing system is provided, which is particularly suitable for fabricating solar cells. The system has a front end module transporting cassettes, each cassette holding a preset number of substrates therein; a loading module coupled to the front end module and having mechanism for loading substrates from the cassettes onto carriers; and a plurality of processing chambers coupled to each other in series, each having tracks for transporting the carriers directly from one chamber to the next; wherein selected chambers comprise combination source having a sputtering module and an evaporation module arranged linearly in the direction of travel of the carriers.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 2 illustrates a cross section of one of chambers 140;

FIG. 3 is a simplified schematic illustrating a combination source according to an embodiment of the invention, while FIG. 3A illustrates a source with multiple thin sputtering sources and FIG. 3B is a simplified schematic illustrating a multiple evaporation source 372 according to an embodiment of the invention.

FIG. 4 is a simplified schematic showing a cross section of a processing chamber having two sources, one on each side, for simultaneous fabrication of both sides of a substrate.

FIG. 5 is a simplified schematic showing a cross section of a processing chamber having two sources, one on each side, for simultaneous fabrication of two substrates.

FIG. 6 illustrates a heater according to an embodiment of the invention, which is structured to have similar fittings onto the chamber as the deposition sources.

FIG. 12 illustrates a processing chamber according to an embodiment of the invention.

FIG. 13 illustrates another evaporator according to an embodiment of the invention.

FIG. 14 illustrates another processing chamber according to an embodiment of the invention.

DETAILED DESCRIPTION

Figure 1:
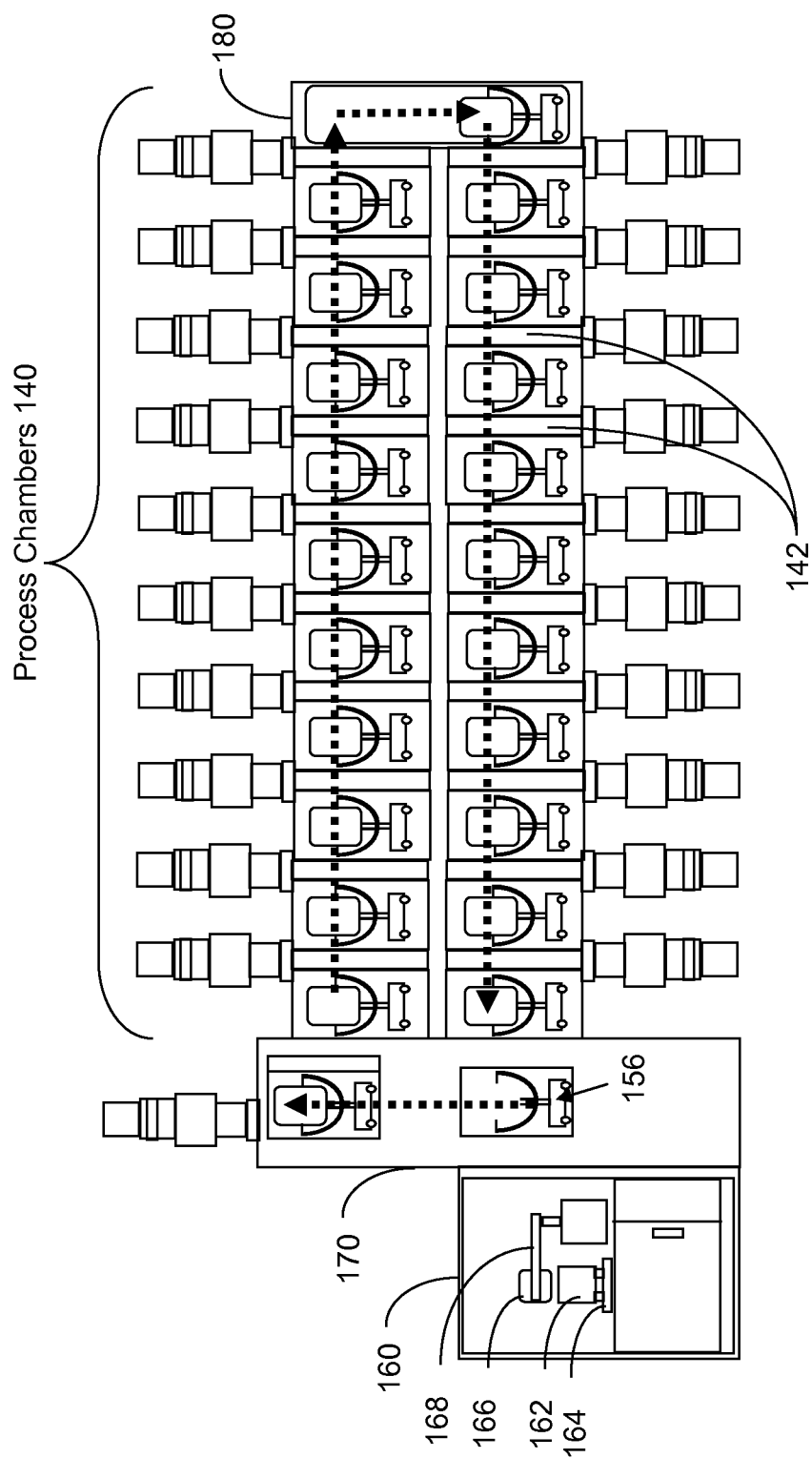
FIG. 1 illustrates a system according to an embodiment of the invention.

A detailed description will now be given of solar cells processing system according to embodiments of the invention. FIG. 1 illustrates a system for high capacity sequential processing of substrates, which employs unique sputter and evaporation combined deposition sources. The system can be used for solar cells production. The system is generally constructed of several identical processing chambers 140 connected in a linear fashion, such that substrates can be transferred directly from one chamber to the next. While in the embodiment of FIG. 1 two rows of chambers are stacked one on top of the other, this is not necessary, but it provides a reduced footprint.

A front end module 160 includes tracks 164 for transporting cassettes 162 containing a given number of substrates 166. The front end unit 160 maintains therein a clean atmospheric environment. A robotic arm 168 removes substrates 166, one by one, from the cassette 162 and transfers them into a loading module 170. Loading module 170 loads each substrate 166 onto a substrate carrier 156, and moves the substrate 166 and carrier 156 into a vacuum environment. In the embodiment of FIG. 1, each carrier is shown to hold a single substrate, but other embodiments can utilize carriers that hold two substrates, either in tandem or back to back. Thereafter the carriers 156 and substrates 166 traverse the processing chambers 140, each of which operates in vacuum and is isolated from other processing chambers by gate valves 142 during processing. The motion of the carrier 156 is shown by the broken-line arrows. Once processing is completed, the substrate 166 is removed from the carrier 156 and is moved to an atmospheric environment and placed in the cassette 162 by robot arm 168.

FIG. 2 illustrates a cross section of one of chambers 140. Substrate 266 is shown mounted vertically onto carrier 256. Carrier 256 has wheels 221, which ride on tracks 224. The wheels 221 may be magnetic, in which case the tracks 224 may be made of paramagnetic material. In this embodiment the carrier is moved by linear motor 226, although other motive forces and/or arrangements may be used. Depositions source 272 is shown mounted onto one side of the chamber 240. The carrier passes by deposition source 272, such that deposition is performed on the surface of the substrate as the substrate is moved passed the source.

FIG. 3 is a simplified schematic illustrating a combination source 372 according to an embodiment of the invention. In this embodiment, combined source 372 includes two sputtering sources 382 and one evaporation source 384. In this embodiment sputtering sources 382 have narrow-elongated sputtering targets 383 and evaporation source 384 includes nozzles 386. In this manner, as the carrier moves the substrate passed the source 272, three layers are deposited over the substrate: first a sputtered layer, then an evaporated layer, and then another sputtered layer. Of course, the order and number of these sources can be changed and be different for each successive chamber. For example, a first chamber may have three sputtering sources for depositing molybdenum layer, while a following chamber may have a first sputtering source, followed by two evaporation sources, wherein the evaporation sources are used to deposit p-type semiconductor, such as copper-indium-gallium-diselenide (CIGS) or copper-indium-diselenide (CIS). The movement and deposition control afforded by lining up the multiple sources 272 and outfitting them with different precursor materials allows precise tailoring of deposited layer to less than 1 nm thickness. The layers may form oxide, semiconductor, conductor, or combinations thereof. Preferred crystallographic orientation in a quasi-epitaxial fashion can be achieved with minimal deposition time in a cost effective manner.

FIG. 3A is a simplified schematic illustrating a multiple (here triple) sputtering source 372 according to an embodiment of the invention. In this embodiment, source 372 includes three thin sputtering sources 382, each having a narrow sputtering target 383. In this embodiment the three sputtering sources may have target 383 of same or different material. In this manner, as the carrier moves the substrate passed the source 272, three layers are deposited over the substrate in sequence. The use of three thin sources enables sequential sputtering of thin layers of different materials or sequential sputtering of three layers of same material with highly accurate control over the thickness of the resulting layer. For example, the three sources can be controlled individually such that each can be turned on/off independently, such that the source may sputter from one, two or all three targets 383. Also, when only one or two sources needs to be turned on, different ones can be turned on at each substrate pass so as to average the use of the targets and prolonged the time between service of the targets 383.

FIG. 3B is a simplified schematic illustrating a multiple (here triple) evaporation source 372 according to an embodiment of the invention. In this embodiment, source 372 includes three evaporation sources 384. In this embodiment the three evaporation sources may have crucibles containing same or different solutions. In this manner the layer formed on the substrate can be precisely controlled. For example, in some solar cells structures, such as CIGS, the layers may have gradients of each of the materials. The use of three evaporation sources in a single chamber enables sequential deposition of thin layers of different materials, to thereby generate the required gradient. For example, the three evaporation sources can be controlled individually such that each can be turned on/off independently to tightly control the amount of each material evaporated onto the substrate.

FIG. 4 illustrates a cross section of a chamber having two sources, 472A and 472B, one on each side, for simultaneous processing on both sides of substrate 466. The sources may be the same or different. For example, one source can be a sputtering source for depositing the back contact, while the other source may be a combination source for depositing the junction layers. FIG. 5 illustrates another embodiment of the invention, wherein the chamber has two sources, 572A and 572B, one on each side of the chamber, but each one used for processing on one surface of one substrate. That is, carrier 556 is structured such that it can support two substrates 566A and 566B, back to back, such that only one surface of each substrate is exposed for processing. In this manner, two substrates can be processed in each cycle, thereby doubling the throughput of the system without or with minimal change to its overall footprint.

Some steps in solar cell fabrication require heat treatment, such as annealing. In order to make the processing flow without interruption, a heater is designed to fit into the same provisions made in the chambers for the deposition source. FIG. 6 illustrates a heater 673, which is structured to have similar fittings onto the chamber as the deposition sources.

The heater 673 employs resistive or ceramic heater element 683. Heater 673 further employs a $Al_2O_3$ or Ti cover 685 (shown in broken line) which covers the heater element 683 to prevent particle deposition on the heater element 683.

Figure 7:
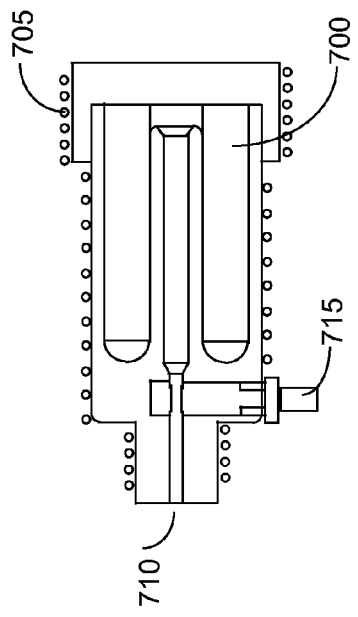
FIG. 7 is a simplified cross-section schematic of an evaporator according to an embodiment of the invention.

FIG. 7 is a simplified cross-section schematic of an evaporator according to an embodiment of the invention. According to this embodiment, each evaporation source, such as source 384 of FIG. 3, consists of several inserts, each forming an evaporator that may be energized independently of other inserts in the same source. This enables increased control of formation of the deposited layers. Each insert includes a crucible 700 containing the liquid to be evaporated, heater 705, e.g., resistive heater, injector 710, and valve 715. The valve 715 can be used to control the amount of deposition material or to completely shut off deposition. In this embodiment the valve is embedded in the crucible body, so that its temperature is the same as that of the crucible, thereby avoiding condensation on the valve and adverse temperature effects on the deposition stream.

Figure 8:
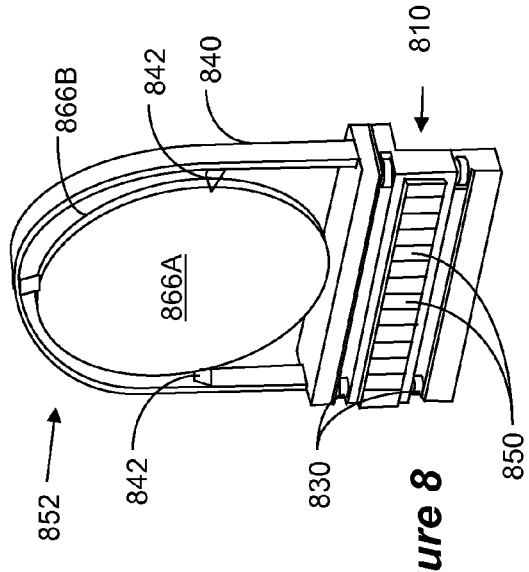
FIG. 8 illustrates a process carrier, which may be used for processing two substrates simultaneously, according to an embodiment of the invention.

FIG. 8 illustrates a process carrier, which may be used for processing two substrates simultaneously. The carrier 852 has a base 810 having wheels 830 and magnets 850. The substrates 866A and 866B are supported by arc 840, which has clips 842 to hold the substrates at the periphery only. In this manner, the entire surface of each substrate is exposed for processing. As illustrated in FIG. 8, two substrates, 866A and 866B are held by clips 842, facing back to back. In this manner, when the carrier enters a processing chamber, the front surfaces of both substrates are processed simultaneously.

Figure 9:
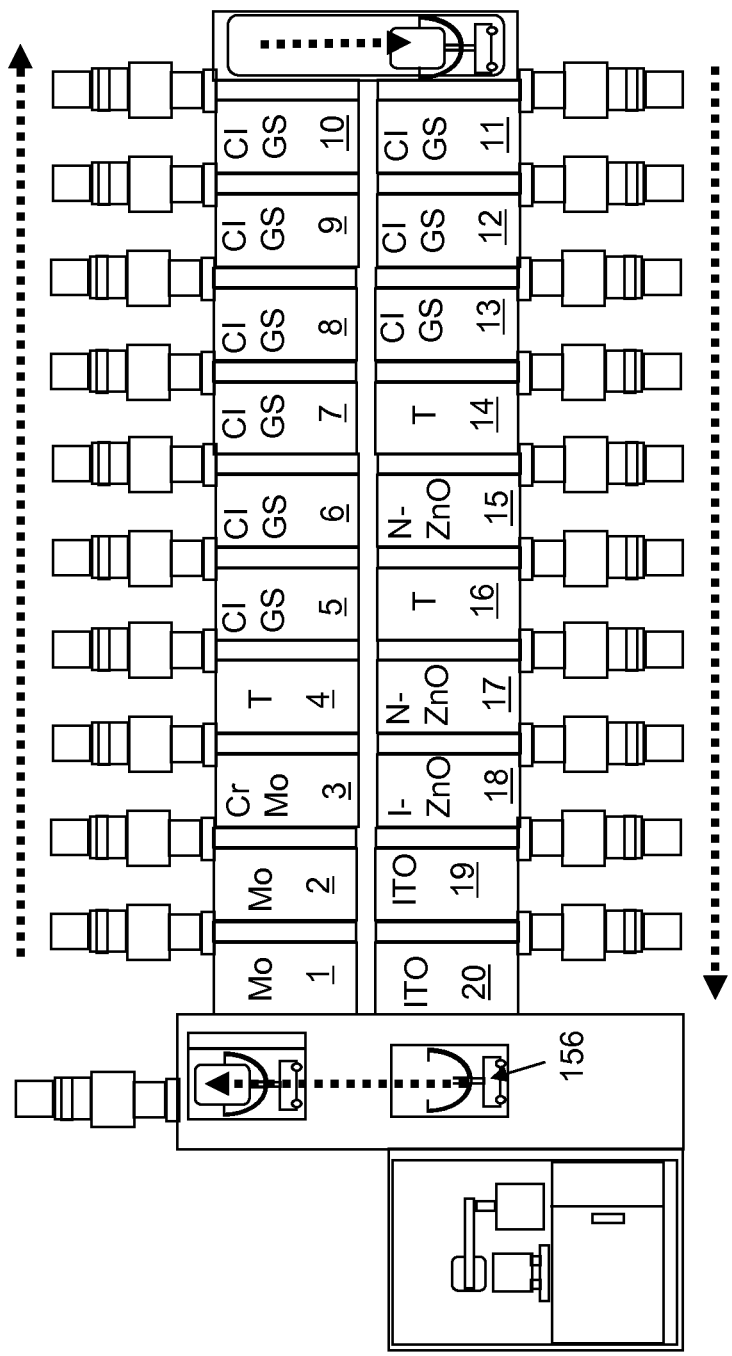
FIG. 9 illustrates a system structured according to an embodiment of the invention for fabricating CIGS solar cells.

FIG. 9 illustrates a system structured according to an embodiment of the invention for fabricating CIGS solar cells. The process begins by depositing the back contact layers starting with molybdenum in chambers 1 and 2, which utilized, e.g., single or multiple sputtering sources. Then a chromium/molybdenum layer is deposited using, e.g., a multiple sputtering source having mixed targets, e.g., first target molybdenum and second and third targets chromium. The fourth chamber houses a heater for high temperature heat treating the deposited contact layers. Then in chambers 5-13, the CIGS layers are being deposited using, e.g., combination sources which provide sputtering and evaporation sources. Chamber 14 is used for cooling the substrate before it enters chamber 15 for deposition of n-doped n-ZnO layer, which can be done using a multiple sputtering or a combination source. Chamber 16 is again used for cooling before another n-ZnO layer is deposited. This is followed by a layer of intrinsic i-ZnO layer in chamber 18, and then two deposition chambers for the ITO, which forms the top transparent contact layer.

Figure 10:
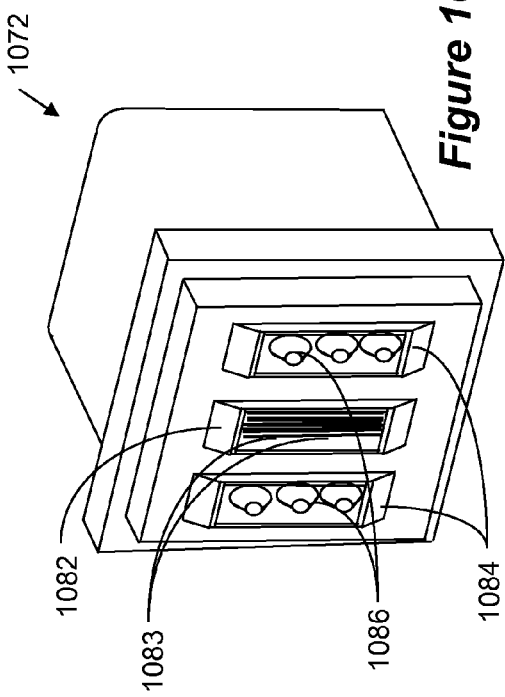
FIG. 10 illustrates yet another embodiment of a mixed sputtering and evaporation source according to the invention.

FIG. 10 illustrates yet another embodiment of a mixed sputtering and evaporation source according to the invention. In the embodiment of FIG. 10, the source includes one sputtering source 1082 having a narrow-elongated sputtering target 1083, and two evaporation sources 1084, each having nozzles 386. The number and arrangement of these mixed sources can be varied, for example the source may include one evaporation and one sputtering source, two sputtering and one evaporation source, etc. In this embodiment, the evaporation sources are controlled so as to create a vapor pressure enabling mixing and/or interaction of the evaporated material, e.g., selenium, with the sputtered material. That is, this source is operated in a single chamber so as to deposit only one layer consisting of evaporated and sputtered material, rather than distinct layers of evaporated and sputtered material.

Figure 11:
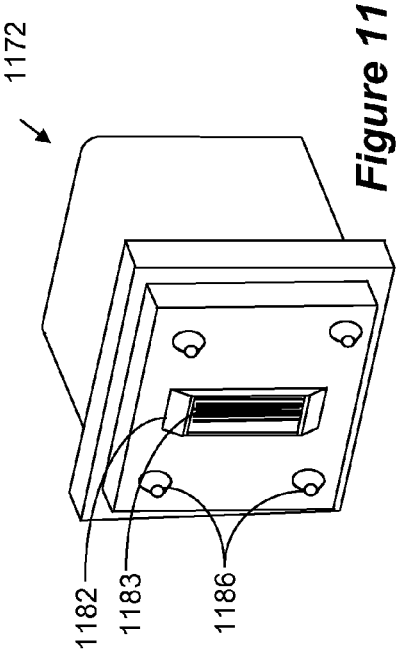
FIG. 11 illustrates yet another embodiment of a mixed sputtering and evaporation source according to the invention.

FIG. 11 illustrates yet another embodiment of a mixed sputtering and evaporation source according to the invention. In the embodiment of FIG. 11, the source includes one sputtering source 1082 having a narrow-elongated sputtering target 1083, and a plurality of evaporation nozzles 1086. In this embodiment the evaporator nozzles are arranged so as to evaporate material, e.g., selenium, so as to mix and interact with the sputtered material to form a layer on the substrate, wherein the layer includes sputtered and evaporated materials. The number and arrangement of the evaporation sources can be varied, for example the evaporation sources can be provided around the sputtering target, to one side of the target, etc. In this embodiment, the evaporation sources are controlled so as to create a vapor pressure enabling mixing and/or interaction of the evaporated material, e.g., selenium, with the sputtered material.

FIG. 12 illustrates a processing chamber according to an embodiment of the invention. In this embodiment, chamber 1240 includes two sputtering sources 1272A and 1272B for sputtering material either on both surfaces of substrate 1266, or each onto one surface of a substrate, similar to what is shown in FIG. 5. Additionally, evaporation sources 1286A and 1286B are provided to evaporate material into the processing chamber. The evaporators are controlled so as to create a vapor pressure enabling mixing and/or interaction of the evaporated material, e.g., selenium, with the sputtered material.

FIG. 13 illustrates another evaporator according to an embodiment of the invention. The evaporator of FIG. 13 has a heated chamber of molten metal 1305, which evaporates vapor into vapor chamber 1315. The vapor from chamber 1315 travels through orifices in diffusion plate 1325 into a second vapor chamber 1325. The vapor than travels through orifices in the second diffusion plate 1345. The second diffusion plate 1345 has more orifices than the first diffusion plate 1325. Also, while only two vapor chambers and two diffusion plates are shown, this is just an example and more diffusion plates can be provided with more vapor chambers. The entire evaporator is heated by a heater that is schematically indicated as circles 1335. The evaporator of FIG. 13 can be used in any embodiment shown above instead of or in addition to the injector-based evaporators. Also, FIG. 14 illustrates an evaporator processing chamber using two evaporators 1472A and 1472B as shown in FIG. 13.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

The present invention has been described in relation to particular examples, which are intended in all respects to be illustrative rather than restrictive. Those skilled in the art will appreciate that many different combinations of will be suitable for practicing the present invention. Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. A substrate processing system comprising:
a front end module for transporting cassettes, each cassette holding a preset number of substrates therein;
a loading module coupled to the front end module and having mechanism for loading substrates from the cassettes onto carriers;
a plurality of processing chambers coupled to each other in series, each processing chamber defining a vacuum chamber isolated from other processing chambers by gate valves, and each processing chamber having tracks for transporting the carriers directly from one processing chamber to the next;
wherein at least one of the plurality of processing chambers comprise at least one combination source, each combination source comprising:
a housing configured to be mounted onto the processing chamber;
a sputtering source housed within the housing; and
an evaporator housed within the housing;
wherein the sputtering source and evaporator are configured to direct material simultaneously therefrom into the vacuum chamber for deposition onto the substrate.

2. The substrate processing system of claim 1, wherein selected processing chambers of the plurality of processing chambers comprise at least one sputtering source, each sputtering source comprising a housing configured to be mounted onto the processing chamber, the housing having a plurality of narrow-elongated sputtering targets arranged linearly in the direction of travel of the carriers.

3. The substrate processing system of claim 1, wherein selected processing chambers of the plurality of processing chambers comprise at least one evaporation source, each evaporation source comprising a housing configured to be mounted onto the processing chamber, the housing having a plurality of evaporators arranged linearly in the direction of travel of the carriers.

4. The substrate processing system of claim 1, wherein the evaporator is nested between two sputtering modules arranged linearly in the direction of travel of the carriers.

5. The substrate processing system of claim 4, wherein the evaporator comprises a plurality of nozzles.

6. The substrate processing system of claim 1, wherein each of said selected processing chambers comprises two combination sources in a facing relationship.

7. The substrate processing system of claim 6, wherein each of said carriers supports two substrates simultaneously, such that one surface of each substrate is exposed to one of the two deposition sources.

8. The substrate processing system of claim 1, wherein the combination source is operable to deposit a single layer on the substrate, the single layer comprising evaporated and sputtered materials.

9. The substrate processing system of claim 1, wherein at least one of the plurality of the plurality of processing chambers comprises a heater, the heater configured to fit into same provisions made in the chamber for combination source and structured to have similar fittings onto the chamber as the combination source.

10. The system of claim 9, wherein the heater comprises one of a resistive heater or ceramic heater, and wherein the heater further comprises a cover comprising Al2O3 or Ti.

11. A substrate processing chamber, comprising:
a chamber body comprising a plurality of gate valves and defining a vacuum chamber, isolated from other processing chambers by the plurality of gate valves;
transport tracks for transporting carriers within the vacuum chamber;
a vacuum pump for evacuating the interior of the vacuum chamber;
at least one processing source,
the processing source comprising:
a housing configured to be mounted onto the chamber body;
a sputtering source housed within the housing; and
an evaporator housed within the housing;
wherein the sputtering source and evaporator are configured to direct material simultaneously therefrom into the vacuum chamber for deposition onto the substrate.

12. The substrate processing chamber of claim 11, wherein the evaporator is nested between two sputtering modules arranged linearly in the direction of travel of the carriers.

13. The substrate processing chamber of claim 12, wherein the evaporator comprises a plurality of nozzles.

14. The substrate processing chamber of claim 12, wherein the evaporator is arranged so as to evaporate material to intermix with the sputtered material to thereby deposit a single layer comprising sputtered and evaporated material onto the substrate.

15. A solar cell fabrication system, comprising:
a plurality of processing chambers coupled to each other in series, each processing chamber isolated from other processing chambers by gate valves and each having tracks for transporting substrate carriers directly from one chamber to the next;
wherein at least one chamber of the plurality of processing chambers comprises a sputtering chamber having at least one sputtering source; at least one chamber of the plurality of processing chambers comprises an evaporation chamber having at least one evaporation source; and at least one chamber of the plurality of processing chambers comprises a mixed chamber having a processing module comprising:
a housing configured to be mounted onto the mixed chamber;
at least one sputtering module housed within the housing;
at least one evaporation module housed within the housing;
wherein the sputtering module and evaporation module are configured to direct material simultaneously therefrom into the vacuum chamber for deposition onto the substrate so as
to simultaneously deposit sputtered and evaporated material on a substrate situated within the mixed chamber.

16. The solar cell fabrication system of claim 15, wherein the sputtering source comprises a plurality of sputtering modules arranged linearly in the direction of travel of the carriers.

17. The solar cell fabrication system of claim 15, wherein the evaporation source comprises a plurality of evaporators arranged linearly in the direction of travel of the carriers.

18. The solar cell fabrication system of claim 17, wherein each of the evaporators comprises a plurality of nozzles, each nozzle having a separately operable valve.

19. The solar cell fabrication system of claim 15, wherein at least one chamber of the plurality of processing chambers comprises a heater.

20. The solar cell fabrication system of claim 15, wherein at least one chamber of the plurality of processing chambers comprises a cooling chamber.

21. The solar cell fabrication system of claim 15, wherein each of the sputtering module and evaporation module of the combination source is operable independently.

* * * * *